United States Patent
Köhler

(10) Patent No.: US 11,762,048 B2
(45) Date of Patent: Sep. 19, 2023

(54) ECHO-SPECIFIC K-SPACE SAMPLING WITH MULTI-ECHO SEQUENCES

(71) Applicant: Siemens Healthcare GmbH, Erlangen (DE)

(72) Inventor: Michael Köhler, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 52 days.

(21) Appl. No.: 17/488,719

(22) Filed: Sep. 29, 2021

(65) Prior Publication Data

US 2022/0099771 A1 Mar. 31, 2022

(30) Foreign Application Priority Data

Sep. 29, 2020 (DE) ...................... 10 2020 212 272.5

(51) Int. Cl.
*G01R 33/48* (2006.01)
*G01R 33/561* (2006.01)
(52) U.S. Cl.
CPC ..... *G01R 33/4818* (2013.01); *G01R 33/5617* (2013.01)
(58) Field of Classification Search
CPC .................. G01R 33/4818; G01R 33/5617
See application file for complete search history.

(56) References Cited

U.S. PATENT DOCUMENTS

| 9,977,106 B2 | 5/2018 | Nehrke et al. | |
|---|---|---|---|
| 2015/0293202 A1* | 10/2015 | Feiweier | G01R 33/565 324/309 |
| 2016/0223635 A1* | 8/2016 | Den Harder | G01R 33/5611 |
| 2018/0120402 A1* | 5/2018 | Nehrke | G01R 33/243 |
| 2022/0099767 A1 | 3/2022 | Kohler | |

FOREIGN PATENT DOCUMENTS

EP 2615470 A1 7/2013

OTHER PUBLICATIONS

Finsterbusch, Jurgen, Jens Frahm, and Martin A. Koch. "Gradient and stimulated echo (GRASTE) imaging." Magnetic Resonance in Medicine: An Official Journal of the International Society for Magnetic Resonance in Medicine 55.2 (2006): 455-459.
German Office Action for German Application No. 10 2020 212 272.5 dated Aug. 11, 2021.
Nehrke, Kay, and Peter Börnert. "DREAM—a novel approach for robust, ultrafast, multislice B1 mapping." Magnetic resonance in medicine 68.5 (2012): 1517-1526.

* cited by examiner

*Primary Examiner* — Gregory H Curran
(74) *Attorney, Agent, or Firm* — Lempia Summerfield Katz LLC

(57) ABSTRACT

In a method, an imaging sequence is irradiated into an examination region in which an examination object is located. The imaging sequence includes an acquisition section. The acquisition section includes acquiring a plurality of echo signals, each of which samples a k-space region of a k-space. The plurality of echo signals comprises a plurality of first echo signals and a plurality of second echo signals. The plurality of first echo signals and the plurality of second echo signals are generated from different magnetization configurations. The k-space regions sampled by the plurality of first echo signals sample the k-space in a different order to the k-space regions sampled by the plurality of second echo signals.

15 Claims, 5 Drawing Sheets

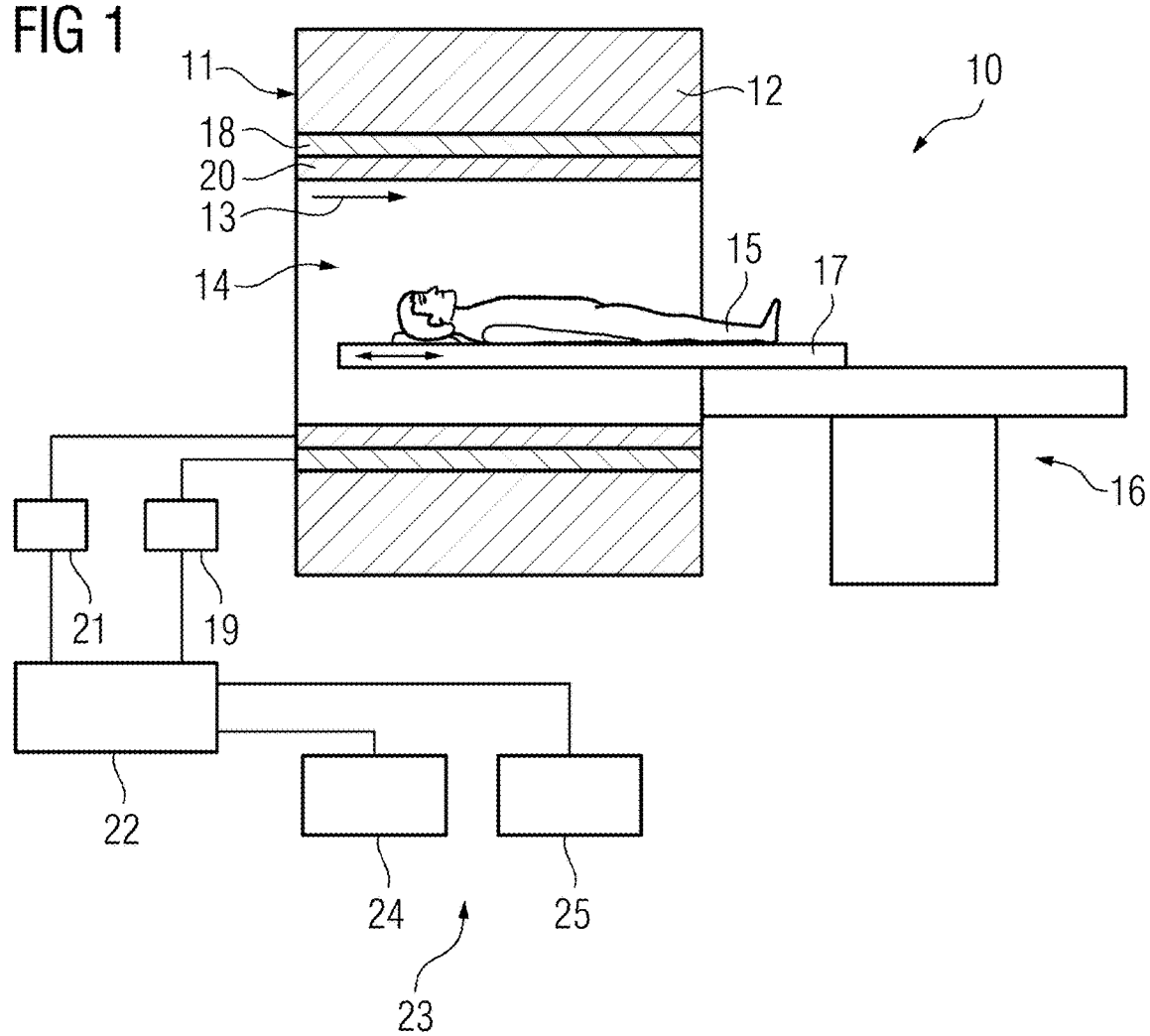
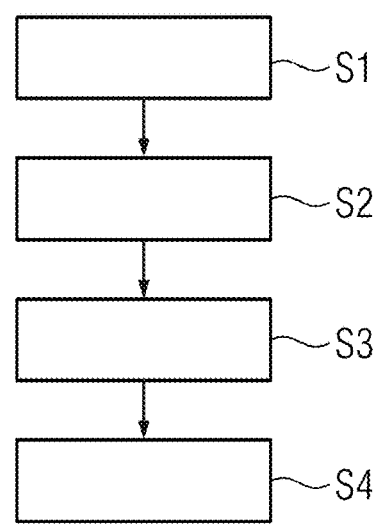

ECHO-SPECIFIC K-SPACE SAMPLING WITH MULTI-ECHO SEQUENCES

This application claims the benefit of German Patent Application Number DE 10 2020 212 272.5, filed on Sep. 29, 2020, which is hereby incorporated by reference in its entirety.

BACKGROUND

The present embodiments relate to methods for the acquisition of echo signals during a magnetic resonance examination of an examination object, to a magnetic resonance device, and to a computer program product for carrying out the method.

In medical technology, imaging using magnetic resonance (MR) (e.g., magnetic resonance imaging (MRI)) is characterized by high soft tissue contrasts. Here, radio-frequency (RF) pulses, in order to generate an RF field (e.g., a $B_1$ field) and gradient pulses, in order to generate a magnetic field gradient, are irradiated with the aid of a magnetic resonance device into an examination region in which the examination object is located. As a result, echo signals (e.g., magnetic resonance signals) are triggered in the patient, and these may be received by the magnetic resonance device as measured data. The echo signals may be spatially encoded, so the echo signals may be used for the reconstruction of magnetic resonance mappings.

Multi-echo sequences may be, for example, MR sequences in which not just one but a plurality of echo signals are triggered by the irradiation of an RF pulse. For example, if a plurality of echo signals emanate from one RF pulse but have a different magnetization history, artifacts may occur with a joint reconstruction and/or evaluation of these echo signals.

SUMMARY AND DESCRIPTION

The scope of the present invention is defined solely by the appended claims and is not affected to any degree by the statements within this summary.

The present embodiments may obviate one or more of the drawbacks or limitations in the related art. For example, artifacts of this kind may be reduced.

A method for acquisition of echo signals during a magnetic resonance examination of an examination object is provided. In one embodiment, an imaging sequence is irradiated into an examination region in which the examination object is located. The imaging sequence includes an acquisition section. The acquisition section includes acquiring a plurality of echo signals, each of which samples a k-space region (e.g., a k-space line) of a k-space. The plurality of echo signals include a plurality of first echo signals and a plurality of second echo signals, where the plurality of first echo signals and the plurality of second echo signals are generated from different magnetization configurations. For example, the plurality of first echo signals vary to different extents compared to the plurality of second echo signals owing to the different magnetization configurations during the acquisition. The k-space regions sampled by the plurality of first echo signals sample the k-space in a different order (e.g., a different order over time) to the k-space regions sampled by the plurality of second echo signals.

The first echo signals may be, for example, FID echo signals, while the second echo signals are stimulated echo signals. One embodiment provides that the FID echo signal is acquired before the stimulated echo signal. A further embodiment provides that the stimulated echo signal is acquired before the FID echo signal.

Further, apart from the plurality of first echo signals and the plurality of second echo signals, the plurality of echo signals may include even further echo signals (e.g., a plurality of third echo signals, a plurality of fourth echo signals etc.) that are each generated from different magnetization configurations. In one embodiment, even further echo signals that are generated from the same magnetization configurations as the first, second, third, or fourth echo signals are acquired.

The terms "first", "second", "third", or "fourth" do not identify the order over time of the acquisition of the echo signals but serve merely to differentiate different types of echo signal.

The order may be chosen such that any artifacts of an image that is reconstructed from the plurality of first echo signals, and any further artifacts that is reconstructed from the plurality of second echo signals, are aligned. For example, the order may be chosen such that the signals of the individual echoes are maximized. In one embodiment, artifacts may be reduced via the echo-specific order in the case of a joint reconstruction and/or evaluation of the first echo signals with the second echo signals. For example, any artifacts (e.g., unavoidable artifacts) in the respective types of echo signal (e.g., first echo signal on the one hand, second echo signal on the other hand) may be coordinated with each other such that the artifacts have less of an effect as a result in the case of joint evaluation.

The examination object is, for example, a human or an animal patient. The magnetic resonance examination may be carried out with the aid of a magnetic resonance device. The magnetic resonance device may include, for example, a radio-frequency antenna unit for the generation of RF pulses and/or a gradient coil unit for the generation of gradient pulses. With the aid of the radio-frequency antenna unit and/or the gradient coil unit, it is possible, for example, to irradiate the imaging sequence into the (e.g., cylindrical) examination region. In one embodiment, a main magnet, the gradient coil unit, and/or the radio-frequency antenna unit surround the examination region.

The k-space may be a two- or three-dimensional data model including measured raw data (e.g., echo signals). For example, the k-space is the same as a raw data matrix that is filled or sampled line-by-line. The axes of the k-space may be designated, for example, kx and ky. The data points of the plane located within these axes may represent spatial frequencies, for example. For example, spatial frequency data may be converted into image data by a Fourier transform.

The plurality of first echo signals may be acquired successively. For example, a first one of the plurality of first echo signals is acquired, then a second one of the plurality of first echo signals is acquired, etc. For example, the plurality of first echo signals have a first magnetization configuration. Similarly, the plurality of second echo signals may be acquired successively. For example, a first one of the plurality of second echo signals is acquired, then a second one of the plurality of second echo signals, etc. For example, the plurality of second echo signals have a second magnetization configuration that differs from the first magnetization configuration. In order to generate different magnetization configurations, apart from the acquisition section, the imaging sequence may include, for example, a preceding preparation section.

The imaging sequence (e.g., the acquisition section) may include an echo train (e.g., a gradient echo train) with a plurality of successive elements. For example, one first echo signal of the plurality of first echo signals and one second echo signal of the plurality of second echo signals, respectively, may be acquired in each element.

The present embodiments are based, for example, on the findings that artifacts and signal variations may affect the individual echoes differently in the case of multi-echo sequences. One possible cause of artifacts is a variation in a transverse magnetization during an echo train of the imaging sequence (e.g., of the acquisition sequence) and/or during a fast MR sequence. For example, the variation in the transverse magnetization may be caused by a variation in a longitudinal magnetization in that the transverse magnetization is generated by irradiating an RF pulse including the varying longitudinal magnetization. What may be considered here is the variation in the transverse magnetization, which is used in the different elements of the echo train for the generation of the echoes and varies over these elements. This problem relates primarily to MR sequences in which the magnetization components are not or are not fully in a steady state. Therefore, this affects, for example, single shot methods in which there is a variation in the magnetization components primarily at the beginning of the echo trains. The variations may be caused, for example, by relaxation effects or saturation effects.

For example, it has been found that a variation in the transverse magnetization may result in different artifacts. For example, with a fast sequence based on gradient echoes, conventionally, the data for a k-space line is acquired in each element (e.g., after each RF pulse). Conventionally, the k-space lines of a slice are not measured directly one after the other. If during the measurement of the outer k-space lines (e.g., corresponding to higher spatial frequencies) there is accordingly lower transverse magnetization than during the measurement of the central k-space lines (e.g., corresponding to lower spatial frequencies), then this may result in blurring in the phase encoding direction after carrying out a Fourier transform. Conversely, in other words, with greater magnetization in the outer k-space lines, an edge overshoot may also occur.

The present embodiments may relate to multi-echo sequences in which in each element of an echo train, and therewith, for example, after each readout RF pulse of the respective element, a plurality of echo signals (e.g., two echo signals) is measured. The problem can occur in this case that the different echoes vary to different extents over the course of the echo train. This may be for different reasons: For example, the different echoes may be generated from different magnetization configurations, or the different echoes may be dominated by different chemical components (e.g., fat or water) that, owing to different relaxation times, have a different variation over the echo train.

For example, FID echo signals are generated from a different magnetization configuration to stimulated echo signals. As a result of the fact that the k-space regions sampled by the plurality of FID echo signals sample the k-space in a different order to the k-space regions sampled by the plurality of stimulated echoes, the different variation in the FID echo signals compared to the stimulated echo signals may be considered over the course of the acquisition of these echo signals. Artifacts may thus be reduced.

For example, the acquisition section includes N elements, where N is, for example, a number of the k-space lines to be acquired. In one embodiment, at least two echoes with different magnetization configuration may be refocused in each element of the echo train: For example, at least one stimulated echo (e.g., that is generated from a longitudinal magnetization prepared in a preparation section) as well as at least one "normal" gradient echo, which may also be regarded as free induction decay (FID) and phasing of which was not prepared in the preparation section. It is thus possible, for example, to ascertain the $B_0$ map for a whole slice with just one preparation section.

The stimulated echo may have a different history or prepared magnetization, and therewith, a different signal behavior to the "normal" gradient echo (FID). Any previously prepared longitudinal magnetization relaxes during the course of the echo train, so the transverse magnetization generated by the RF pulses similarly decreases during the course of the echo train. The magnetization component, which is available for forming the stimulated echo, therefore decreases during the echo train. By contrast, the fraction of the unprepared longitudinal magnetization, from which the FID echo signal is formed, increases during the course of the echo train, and this may result in an increase in the transverse magnetization generated by the RF pulses accordingly. As a result, it is possible for the data sets or images reconstructed from the different echoes to exhibit different artifacts.

In one embodiment, the acquisition section also includes irradiating a plurality of gradient pulses in a phase encoding direction, which are capable of setting the k-space regions to be sampled by the echo signals. In one embodiment, this makes it possible for the k-space regions sampled by the first echo signals to sample the k-space in a different order to the k-space regions sampled by the plurality of second echo signals.

Magnetic field gradients may be generated in the examination region by gradient pulses. If the field gradients are applied in the phase encoding direction, the position of a k-space region to be sampled subsequently may be set as a result.

In one embodiment, the plurality of gradient pulses includes gradient pulses in the phase encoding direction that are irradiated between the acquisition of one first echo signal of the plurality of first echo signals and the acquisition of one second echo signal of the plurality of second echo signals, so the position of the k-space regions sampled by these two echo signals differs. In one embodiment, these two echo signals are acquired within the same element of an echo train.

In one embodiment, the order of the k-space regions sampled by the first echo signals is characterized in that spacing of the k-space regions from the k-space center decreases during the course of acquisition of the first echo signals. Such an order may be generated, for example, by an anticentric reordering of the k-space regions to be sampled. The term "reordering" will also be used hereinafter.

In one embodiment, the order of the k-space lines sampled by the second echo signals is characterized in that spacing of the k-space lines from the k-space center increases during the course of acquisition of the second echo signals. Such an order may be generated, for example, by a centric reordering of the k-space regions to be sampled.

For example, the spacing from the k-space center decreases or increases successively and/or in succession. This does not necessarily mean that the spacing constantly decreases or increases (e.g., that each successive spacing has to be smaller or larger than the preceding one). In one embodiment, therefore, two directly successive spacings are equal in size. For example, a rolling mean of the spacings of ten directly successive first or second echo signals decreases or increases constantly.

It is conventional that the same reordering is applied to the two types of echo (e.g., for the first echo signal and the second echo signal). Examples of reordering. In order to create, for example, a $B_1$ map, it may be advantageous to apply a centric reordering to both an FID echo signal and to a stimulated echo signal; in other words, the central k-space lines are measured first of all. For the calculation of a $B_1$ map, which is calculated from the magnitude ratios of the two data sets, this is advantageous for minimizing the distortion of the calculated $B_1$ values caused by $T_1$ effects. This may also be advantageous for the calculation of a $B_0$ map that may be calculated from the phase differences of the two data sets in order to maximize the signal-to-noise ratio of the stimulated echoes. The central k-space lines of the stimulated echoes are then acquired while the magnetization available for this is at a maximum. The image, which is reconstructed from the stimulated echo and magnetization of which decreases during the course of the echo train, then conventionally has blurring in the phase encoding direction, while the data set of the FID echo signal, magnetization of which increased during the course of the echo train, may have an edge overshoot and ghosting of the edges in the phase encoding direction. Both effects may contribute to maps calculated from the data sets, such as $B_1$ and $B_0$ maps, being especially distorted by artifacts. A further problem of centric reordering emerges: even if the signal of the central k-space lines of the stimulated echo signal is maximized as a result, the central k-space lines of the FID echo signal are measured while magnetization is at a minimum. This has an adverse effect on the signal-to-noise-ratio of the image reconstructed from the FID echo signal.

The echo-specific order of the k-space regions sampled by the first and second echo signals of one or more of the present embodiments may improve the quality of maps (e.g., a $B_0$ map) generated therefrom.

For example, different reordering for the stimulated echo signal and the FID echo signal may provide that the artifacts of the two echoes become more similar: if the central k-space lines of the two echoes are measured when the maximum magnetization is available, blurring in the phase encoding direction will be evident in the images of the two echoes. The similarity of the artifacts may be advantageous in the data calculated from the two echoes (e.g., a $B_0$ map), since then, for example, map artifacts are no longer intensified to the usual extent. In addition, the centric/anticentric combination has the advantage that the signal-to-noise ratio of both the stimulated echo signal and of the FID echo signal are maximized simultaneously. With a centric acquisition for the two echoes, this maximization may only be achieved for the stimulated echo signal. As a result, for example, a flip angle of RF pulses may be increased in any preparation section without the signal of the FID suffering too greatly as a consequence.

A further embodiment of the method provides that the acquisition section also includes irradiating a plurality of readout RF pulses, where each readout RF pulse of the plurality of readout RF pulses is capable of triggering at least one first echo signal of the plurality of first echo signals and/or at least one second echo signal of the plurality of second echo signals.

In one embodiment, different information may be obtained from different magnetization configurations of the first echo signals and the second echo signals with just one readout RF pulse.

For example, the plurality of readout RF pulses includes at least one first readout RF pulse and one second readout RF pulse, where the first readout RF pulse is irradiated before the second readout RF pulse. For example, a first FID echo signal and a first stimulated echo signal are acquired after the first readout RF pulse. For example, a second FID echo signal and a second stimulated echo signal are acquired after the second readout RF pulse.

For example, a first k-space line is sampled with the first FID echo signal, and a second k-space line is sampled with the second FID echo signal. For example, a third k-space line is sampled with the first stimulated echo signal, and a fourth k-space line is sampled with the second stimulated echo signal. For example, the first k-space line has a greater spacing from the k-space center than the second k-space line. For example, the third k-space line has a smaller spacing from the k-space center than the fourth k-space line.

A further embodiment of the method provides that the imaging sequence also includes a preparation section preceding the acquisition section, where a phasing of the plurality of second echo signals is prepared by the preparation section.

For example, the preparation section may include irradiating at least two preparation RF pulses. In one embodiment, a longitudinal magnetization is prepared in the preparation section. In one embodiment, an additionally generated transverse magnetization is dephased within the preparation section by a spoiler gradient pulse after the last (e.g., the second) of the at least two preparation RF pulses.

Conventionally, the method also includes generating a main magnetic field during the imaging sequence and deriving a map from the first echo signals and the second echo signals. The map may be, for example, a $B_0$ map that specifies the actual spatial distribution of the magnetic field strength of the main magnetic field.

The main magnetic field may be generated by a main magnet (e.g., a superconducting magnet). The main magnetic field is generated, for example, in the examination region.

The $B_0$ map may be used, for example, to optimize shim currents in a manner specific to the patient, to ascertain a local resonance frequency, or to carry out image correction methods.

The magnetic resonance device may also include an evaluation unit that is configured for deriving a $B_0$ map. For this, the evaluation unit may include one or more processors and/or an electronic storage device. For example, the evaluation unit may be part of a system control unit.

Conventionally, MR sequences with a plurality of echo signals (e.g., two echo signals) are used for the generation of a $B_0$ map, from the phase difference of which signals a spatial distribution of the resonance frequency is calculated. Since the resonance frequency is proportional to the $B_0$ field strength, a $B_0$ map is obtained therefrom. In a simple and conventionally applied case, two echo signals (e.g., in a gradient echo sequence) having echo times that differ by $\Delta TE$ are measured. After reconstruction of the measured data pertaining to the two echo signals, the resonance frequency f or the $B_0$ field strength is calculated from the phase difference $\Delta\Phi$ thereof as follows:

$$B_0 = \frac{2\pi f}{\gamma}; f = \frac{\Delta\Phi}{2\pi \Delta TE} \quad \text{(equ. 1)}$$

Here, $\gamma$ is the gyromagnetic ratio.

The resonance frequency f or the $B_0$ map may be calculated from the measured phase differences according to equ. 1 in that there $\Delta TE$ is replaced by an effective dephasing time $\Delta TE_{\mathit{eff}}$. Here, this effective dephasing time $\Delta TE_{\mathit{eff}}$ may denote the difference in the time spans during which the first echo signal and the second echo signal (e.g., the signals of the FID echoes and of the stimulated echoes) accumulate one phase respectively due to off-resonance. Here, off-resonance denotes a deviation of an actual resonance frequency from a desired resonance frequency. The desired resonance frequency conventionally corresponds to an MR system frequency being used, at which the magnetic resonance device operates. The MR system frequency may be re-set, for example, for each measurement. An off-resonance exists, for example, if at a particular location the actual resonance frequency does not match the set MR system frequency or the desired resonance frequency for a particular chemical component (e.g., protons bound in fat or water, therefore).

A further embodiment of the method provides that the imaging sequence includes a preparation section preceding the acquisition section, where the imaging sequence includes irradiating at least two preparation RF pulses during the preparation section. Between irradiating one of the at least two preparation RF pulses and irradiating a further one of the at least two preparation RF pulses, there is a time span TS. Further, a plurality of readout RF pulses are irradiated during the acquisition section. One of the first echo signals is acquired in each case after one readout RF pulse of the plurality of readout RF pulses, with there being a time span $TE_{FID}$ between irradiating one readout pulse of the plurality of readout RF pulses and acquiring the respective first echo signal. In addition, one second echo signal of the plurality of second echo signals is acquired in each case after one readout RF pulse of the plurality of readout RF pulses, with there being a time span $TE_{STE}$ between irradiating one readout RF pulse of the plurality of readout RF pulses and acquiring the respective second echo signal. Finally, the time span TS is chosen such that echo signals including protons bound in water and echo signals including protons bound in fat experience a same dephasing. In other words, the time span TS is chosen such that between the instant at which the at least one FID echo signal is acquired, and the instant at which the at least one stimulated echo signal is acquired, a signal component of the echo signals including protons bound in water has a same phase difference to a signal component of the echo signals including protons bound in fat.

$TE_{MD}$ may designate the echo time of the FID gradient echo signal, $TE_{STE}$ may designate the echo time of the stimulated echo signal, and TS may designate the spacing (or center-center) of the preparation RF pulses of the preparation section. The echo times are measured, for example, between maximum and/or center of the readout RF pulse of the acquisition section and the respective echo signal and may be set by suitable choice of gradient pulses to be irradiated (e.g., with respect to sign and/or amplitude).

This lengthening of the time span TS potentially leads initially also to a lengthening of the measurement time, but this lengthening is to be accepted only once per measured slice. With conventional methods, additional time is necessary for each line of a slice. The measurement time of a magnetic resonance examination may be reduced overall thereby.

For example, the time span TS is chosen according to the following formula:

$$TS = N * \frac{1}{\delta_{WF} * (\gamma/2\pi) * B_{0,desired}} + TE_{STE} - TE_{FID}, \quad \text{(equ. 2)}$$

where N is a whole number>0 (e.g., N=1), $\delta_{WF}$ specifies the chemical shift of water and fat, and $\gamma$ specifies the gyromagnetic ratio of protons bound in water.

The value 3.4 ppm is conventionally specified for $\delta_{WF}$. The value 42.577 MHz/T is conventionally specified for $\gamma/2\pi$.

The first summand on the right-hand side of equ. 2 may be interpreted as the lengthening of the time span TS in order for the echo signals including protons bound in water and echo signals including protons bound in fat to experience a same dephasing.

In one embodiment, N=1 in order to keep the additional measurement time caused by TS as low as possible.

A further embodiment of the method provides that the desired magnetic field strength $B_{0,desired}$ is less than 2 T (e.g., less than 1 T).

A large reduction in the measurement time compared to conventional methods may be achieved precisely with low field strengths.

Whereas, for example at 3 T, according to equ. 2, a value of just 2.4 ms results for $\Delta TE$, it is already at 4.8 ms at 1.5 T and at 0.6 T at 12 ms.

The appropriate echo time difference, and therewith also the measurement time required overall, is much longer for lower field strengths than for greater field strengths, therefore. Overall measurement times that are longer by several seconds than in the case of greater field strengths result in the case of low field strengths for typical magnetic resonance examinations when conventional methods are applied.

A measurement time that is substantially independent of the field strength used may be achieved by the proposed method, however, since, owing to the use of the double echo, the increased echo time difference that is necessary is to be considered less frequently during the course of the imaging sequence.

Further, a magnetic resonance device that is configured to carry out one of the above-described methods for the acquisition of echo signals during a magnetic resonance examination of an examination object is provided.

The advantages of the proposed magnetic resonance device substantially match the advantages of the methods for the acquisition of echo signals during a magnetic resonance examination of an examination object, which have been stated above in detail. Features, advantages, or alternative embodiments mentioned in this connection may likewise also be transferred to the other subject matters, and vice versa.

Further, a computer program product that includes a program and may be loaded directly into a storage device (e.g., a non-transitory computer-readable storage medium) of a programmable system control unit of a magnetic resonance device, and has program means (e.g., libraries and help functions) in order to carry out a method of one or more of the present embodiments when the program is run in the system control unit of the magnetic resonance device is provided. The computer program product may include software with a source code that still is to be compiled and linked or is only to be interpreted, or an executable software code that is only to be loaded into the system control unit for execution.

The method of the present embodiments for the acquisition of echo signals during a magnetic resonance examination of an examination object may be carried out quickly, so as to be identically repeated and robustly by way of the computer program product. The computer program product is configured such that the computer program product may carry out the method acts of the present embodiments by the system control unit. The system control unit has, in each case, for example, an appropriate working memory, an appropriate graphics card, or an appropriate logic unit, so the respective method acts may be efficiently carried out.

The computer program product is stored, for example, on a computer-readable medium (e.g., a non-transitory computer-readable storage medium) or on a network or server, from where the computer program may be loaded into the processor of a local system control unit that is directly connected to the magnetic resonance device, or may be configured as part of the magnetic resonance device. Further, control information of the computer program product may be stored on an electronically readable data carrier. The control information of the electronically readable data carrier may be configured to carry out a method of the present embodiments when the data carrier is used in a system control unit of a magnetic resonance device. Examples of electronically readable data carriers are a DVD, a magnetic tape, or a USB stick on which electronically readable control information (e.g., software) is stored. All embodiments of the methods described above may be carried out if this control information is read from the data carrier and stored in a system control unit of the magnetic resonance device. The present embodiments may thus also start from the computer-readable medium and/or the electronically readable data carrier.

BRIEF DESCRIPTION OF THE DRAWINGS

Further advantages, features, and details of the present embodiments may be found in the exemplary embodiments described below and with reference to the drawings. Mutually corresponding parts are provided with same reference characters in all figures.

FIG. 1 shows one embodiment of a magnetic resonance device in a schematic representation;

FIG. 2 shows one embodiment of a method in a block representation;

DETAILED DESCRIPTION

Figure 3:
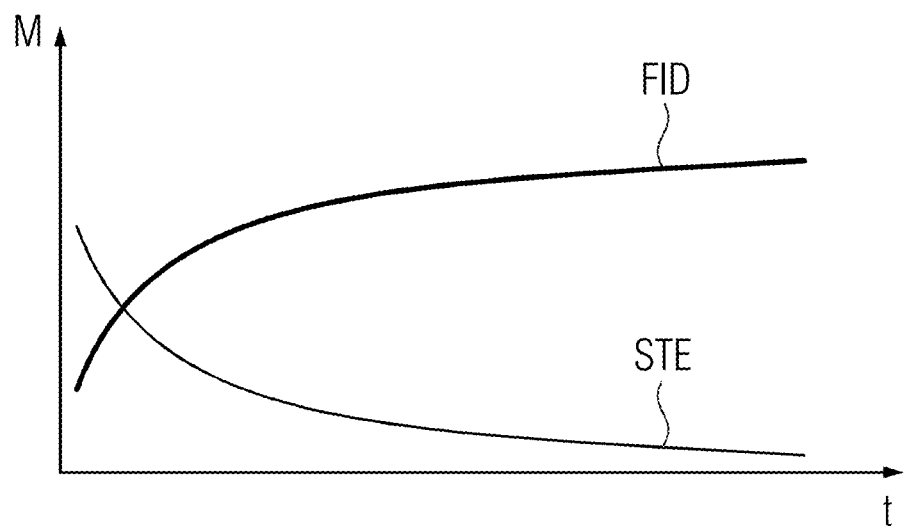
FIG. 3 shows exemplary magnetization components that are available after suitable preparation for generation of a stimulated echo signal and an FID echo signal, in a simplified representation.

FIG. 1 schematically represents one embodiment of a magnetic resonance device 10. The magnetic resonance device 10 includes a magnet unit 11 that has a main magnet 12 for generating a strong and, for example, time-constant main magnetic field 13 with a desired magnetic field strength $B_{0,desired}$. The desired magnetic field strength $B_{0,desired}$ is, for example, less than 2 T. In addition, the magnetic resonance device 10 includes an examination region 14 for a scan of a patient 15. In the present exemplary embodiment, the examination region 14 is cylindrical in design and surrounded in a circumferential direction by the magnet unit 11. In principle however, a different design of the examination region 14 may be provided. The patient 15 may be pushed by a patient supporting device 16 of the magnetic resonance device 10 into the examination region 14. For this purpose, the patient supporting device 16 has a patient couch 17 configured so the patient couch 17 may move inside the examination region 14.

The magnet unit 11 also has a gradient coil unit 18 for generation of magnetic field gradients by irradiating gradient pulses that are used, inter alia, for spatial encoding during imaging. The gradient coil unit 18 includes, for example, three gradient coils for each one spatial direction. The gradient coil unit 18 is controlled by a gradient control unit 19 of the magnetic resonance device 10. The magnet unit 11 also includes a radio-frequency antenna unit 20 that, in the present exemplary embodiment, is configured as a body coil permanently integrated in the magnetic resonance device 10. The radio-frequency antenna unit 20 is controlled by a radio-frequency antenna control unit 21 of the magnetic resonance device 10 and irradiates radio-frequency pulses into an examination space, which is substantially formed by an examination region 14 of the magnetic resonance device 10. As a result, an excitation of atomic nuclei is established in the main magnetic field 13 generated by the main magnet 12. Magnetic resonance signals (e.g., echo signals) are generated by relaxation of the excited atomic nuclei. The radio-frequency antenna unit 20 is configured to receive the echo signals.

The magnetic resonance device 10 has a system control unit 22 for control of the main magnet 12 of the gradient control unit 19 and for control of the radio-frequency antenna control unit 21. The system control unit 22 centrally controls the magnetic resonance device 10, such as performance of a predetermined imaging gradient echo sequence. In addition, the system control unit 22 includes an evaluation unit (not shown) for an evaluation of the echo signals that are acquired during the magnetic resonance examination. For example, the evaluation unit is configured to generate a $B_0$ map based on the echo signals. The $B_0$ map specifies an actual spatial distribution of the magnetic field strength of the main magnetic field 13. Further, the magnetic resonance device 10 includes a user interface 23 that is connected to the system control unit 22. Control information, such as imaging parameters, and reconstructed magnetic resonance mappings may be displayed on a display unit 24 (e.g., on at least one monitor) of the user interface 23 for a medical operator. Further, the user interface 23 has an input unit 25, by which information and/or parameters may be input by the medical operator during a measurement process.

FIG. 2 schematically represents a method for the acquisition of echo signals during a magnetic resonance examination of an examination object. In S1, a preparation section of an imaging sequence is irradiated into the examination region in which the examination object is located. A longitudinal magnetization, for example, is prepared by the preparation section.

In S2, an acquisition section of the imaging sequence is irradiated into the examination region. The acquisition section includes acquiring a plurality of echo signals, each of which samples a k-space region of a k-space. The plurality of echo signals include a plurality of first echo signals and a plurality of second echo signals. The plurality of first echo signals and the plurality of second echo signals are generated from two different magnetization configurations, with one of these magnetization configurations having been prepared in the preparation section. In this case, the k-space regions sampled by the plurality of first echo signals sample the k-space in a different order to the k-space regions sampled by the plurality of second echo signals.

In S3, a map (e.g., a $B_0$ map) is derived from the plurality of first echo signals and the plurality of second echo signals.

The further figures are intended to explain why an echo-specific order may be advantageous when sampling the k-space.

Figure 7:
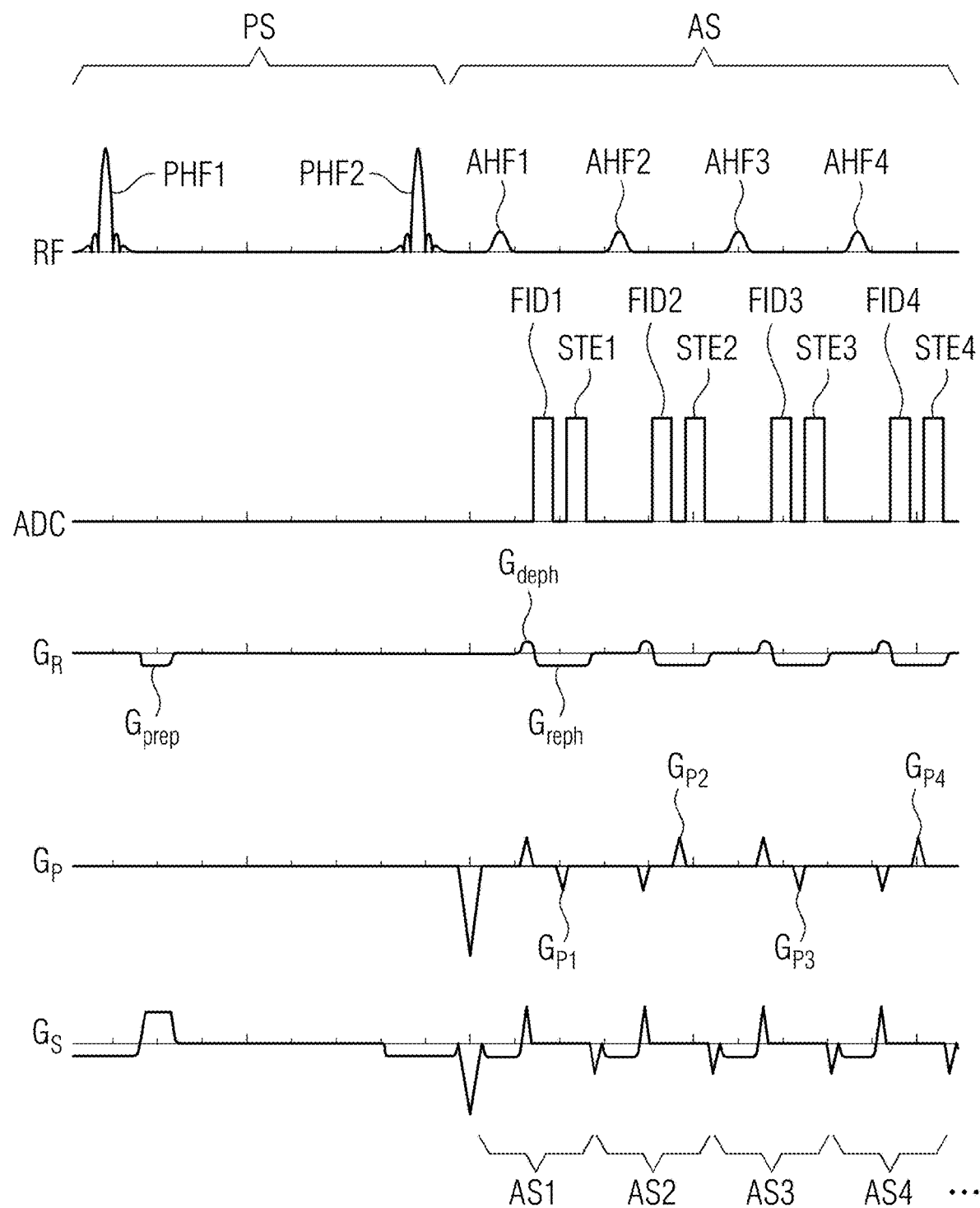
FIG. 7 shows an exemplary sequence diagram for acquisition of stimulated echo signals and FID echo signals with optimized k-space sampling.

This may take place based on an imaging sequence, as is represented in FIG. 7. This sequence allows, for example, measurement of a $B_0$ map. The first echo signals are, for example, FID echo signals, and the second echo signals are, for example, stimulated echo signals. The sequence includes a preparation section PS and an acquisition section AS. RF pulses are represented on the axis RF, readout windows are represented on the axis ADC, and gradient pulses are represented on the axes $G_R$, $G_P$ and $G_S$. The axis $G_R$ corresponds to a readout direction (e.g., frequency encoding direction), the axis $G_P$ corresponds to a phase encoding direction, and the axis $G_S$ corresponds to a slice selection direction.

In the preparation section PS, a longitudinal magnetization or a phasing of a subsequent echo signal is prepared. For this, two preparation RF pulses PHF1 and PHF2 are irradiated into the examination region 14 (see axis RF). A phase accumulation takes place for this purpose in the time span between irradiating the preparation RF pulses PHF1 and PHF2. Any generated transverse magnetization may be dephased after the second preparation RF pulse PHF2 with a spoiler gradient pulse represented here on the axes $G_P$ and $G_S$.

The subsequent acquisition section AS includes a gradient echo train. Only four elements AS1, AS2, AS3, AS4 of the gradient echo train are represented here, but the gradient echo train may include many more elements. For example, the number of elements corresponds to the number of k-space lines acquired for each echo signal. Each element includes a readout RF pulse that is capable of triggering at least two echo signals. For example, at least two echoes are refocused in each element of the gradient echo train: at least one stimulated echo (e.g., generated from the longitudinal magnetization prepared in the preparation section PS) and at least one "normal" gradient echo, which may also be regarded as free induction decay (FID) and phasing of which was not prepared in the preparation section PS. Each of the elements includes a readout RF pulse (e.g., AF1 in the element AS1) and two acquisition windows (e.g., FID1 and STE1 in the element AS1) for the acquisition of one echo signal respectively (see axis ADC). One FID echo signal, respectively, is acquired during the acquisition windows FID1, FID2, FID3 and FID4. One stimulated echo signal, respectively, is acquired during the acquisition windows STE1, STE2, STE3 and STE4.

In order to set the instants at which the FID echo signal and the stimulated echo signal occurs, first, a gradient pulse $G_{prep}$ is irradiated into the examination region 14 between the two preparation RF pulses PHF1 and PHF2 during the preparation sections PS. Further, a dephasing gradient pulse $G_{deph}$ is irradiated into the examination region 14 in each element of the acquisition section AS after irradiating the readout RF pulse, (e.g., AHF1 for AS1) and before the acquisition of the FID signal (e.g., FID1 for AS1) and of the stimulated echo signal (e.g., STE1 for AS1). In addition, a rephasing gradient pulse $G_{reph}$ is irradiated into the examination region 14 during acquisition of the FID signal and of the stimulated echo signal during the acquisition section AS.

In general, the respective echo signal occurs if the rephasing gradient moment is the same as a preceding dephasing gradient moment. The instants of the FID echo signal and of the stimulated echo signal may be set accordingly by the timing and the form (e.g., the sign and amounts) of the gradient pulses $G_{prep}$, $G_{deph}$ and $G_{reph}$.

The unit including preparation section PS and acquisition section AS may be repeated for the measurement of different slices, and an implementation for 3D measurement is likewise possible.

The stimulated echo has a different history or prepared magnetization, and therewith a different signal behavior, to the FID echo. The longitudinal magnetization prepared in the preparation section PS relaxes during the course of the echo train, so the transverse magnetization generated by the readout RF pulses AHF1, AHF2, AHF3, AHF4 likewise decreases during the course of the echo train. As is represented in FIG. 3, the magnetization component, which is available for the formation of the stimulated echoes STE, consequently decreases during the echo train. By contrast, the fraction of the unprepared longitudinal magnetization, from which the FID echo FID is formed, increases during the course of the echo train, and this may accordingly result in an increase in the transverse magnetization generated by the readout RF pulses AHF1, AHF2, AHF3, AHF4. As a result, it may be the case that data sets or images reconstructed from the different echoes, STE compared to FID, therefore, exhibit different artifacts.

Conventional sequences often use a linear reordering in which the k-space is run through linearly to a certain extent, beginning with the outer k-space lines of the one half of the k-space, then central lines and then outer lines of the other half of the k-space. This is shown by way of example in FIG. 4 for eight k-space lines.

One possibility for the optimization of the sequence may be to apply a centric reordering to both echoes (e.g., the k-space regions sampled by the echo signals the k-space are brought into an order), so the central k-space lines are measured first of all. This is represented by way of example in FIG. 5 for eight k-space lines. For one possible calculation of a $B_1$ map, which is calculated from the magnitude ratios of the two data sets, this may be advantageous in order to minimize any distortions of the $B_1$ values to be calculated caused by $T_1$ effects. This may also be advantageous for the calculation of a $B_0$ map that is calculated from phase differences of the two data sets in order to maximize the signal-to-noise ratio of the stimulated echo signal. The central k-space lines of the stimulated echoes STE are then acquired while the magnetization available for this is at a maximum.

This is shown in FIG. 3, which in a simplified manner represents magnetization components that are available for the generation of the stimulated echo STE and of the FID echo FID, as a function of the time t following the preparation section PS. An image that is reconstructed from the stimulated echo STE and magnetization of which decreases during the course of the echo train then conventionally has blurring in the phase encoding direction, while the one image, which is reconstructed from the FID echo FID, may have an edge overshoot and ghosting of the edges in the phase encoding direction; see the upper illustration in FIG. 8. Both effects may contribute to maps ascertained from the acquired FID echo signals and stimulated echo signals, such as $B_1$ maps or $B_0$ maps, being distorted to a great extent by artifacts. A further problem of centric reordering emerges: even if the signal of the central k-space lines of the stimulated echoes STE is maximized as a result, the central k-space lines of the FID echo FID are measured while the magnetization thereof is at a minimum. The has an adverse effect on the signal-to noise ratio of the image reconstructed from the FID echo signal.

Conventional approaches to the minimization of the above-described problems envisage an optimization of the sequence over time. Due to the minimization of the length of the echo train the effects of the $T_1$ relaxation over this echo train, and therewith the opposed artifacts (e.g., blurring of the stimulated echoes and edge overshoot in the FID echo signal) are also minimized.

The present embodiments may provide the possibility of effectively reducing the above-described artifacts of the two echoes STE and FID and of maximizing the echo signals of the two echoes.

Figure 4:
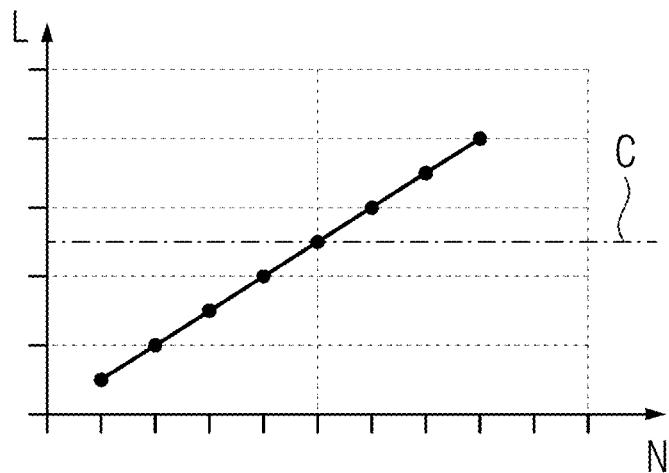
FIG. 4 shows an exemplary linear order for sampling a k-space.
Figure 5:
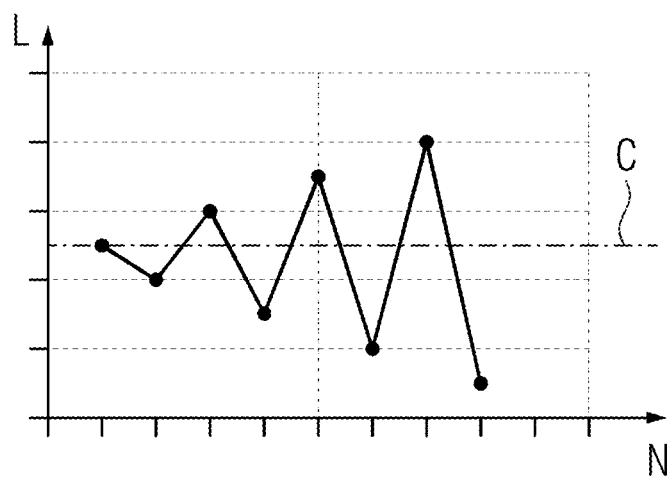
FIG. 5 shows an exemplary centric order for sampling a k-space.
Figure 6:
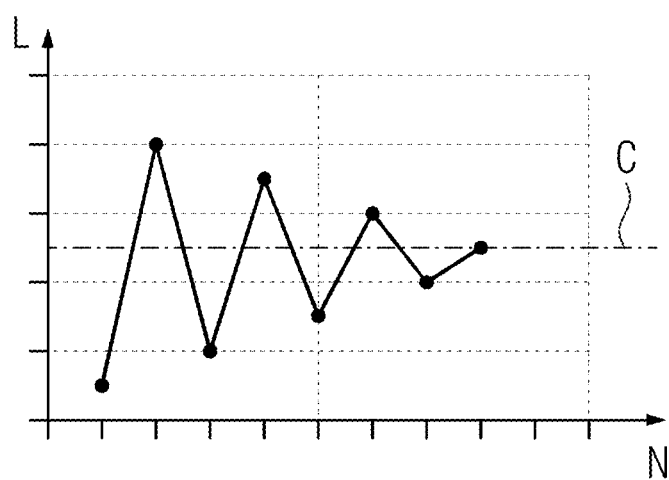
FIG. 6 shows an exemplary anticentric order for sampling a k-space.

For example, provision is made in this case for using different reorderings for the individual types of echo in a multi-echo method (e.g., different orders of the acquisitions of the k-space regions, such as k-space lines, for the different types of echo). It is conventional for the same reordering to be applied to both echoes. Examples of different reorderings are shown in a simplified manner in FIGS. 4-6 for eight k-space lines. A linear reordering is shown in FIG. 4. The k-space lines are, for example, measured in turn (e.g., in ascending or descending order). A centric reordering is shown in FIG. 5. In FIG. 5, the central k-space line is measured first, then the k-space lines located further out are successively measured. The order of the k-space regions sampled by the echo signals is characterized in that spacing from the k-space center increases during the course of acquisition of the echo signals, therefore. Anticentric reordering is shown in FIG. 6. In FIG. 6, the outer k-space lines are measured first, and then, k-space lines located further in are successively measured until, at the end, the central k-space line is measured. The order of the k-space regions sampled by the echo signals is characterized in that spacing of the k-space regions from the k-space center decreases during the course of acquisition of the echo signals.

Even further reorderings may be provided, however. For example, randomized arrangements and different interleavings of the acquisition order of the two phase encoding directions in the case of 3D measurements may be provided.

By way of example, the following imaging sequence is provided: a sequence with a preparation section PS and an acquisition section AS is used, with the acquisition section AS including an echo train with a plurality of elements, where at least two echo signals in each element are used for acquisition. A $B_0$ map may be reconstructed from the at least two echo signals in that the phase differences of the at least two echo signals are used for the calculation thereof. At least two different reorderings are used for the at least two echo signals. For example, centric reordering is used for at least one of the echo signals; anticentric reordering is used for at least one other echo signal.

For example, an imaging sequence according to FIG. 7 may be provided. Here, two echo signals are used per element of the echo train AS1, AS2, AS3, AS4 or per readout RF pulse AHF1, AHF2, AHF3, AHF4 (e.g., the FID echo signal with an anticentric reordering and the stimulated echo signal with a centric reordering). A $B_0$ map may be reconstructed from the phase differences of the data sets reconstructed from the two echo signals. The method provided is not limited to this special case.

The different reordering of the individual echoes may be generated by additional gradient pulses in the phase encoding direction between the acquisition windows of the echoes (e.g., by the gradient pulse $GP_1$ between the acquisition windows FID1 and STE1 in the element AS1). The same applies to the gradient pulses $GP_2$, $GP_3$, and $GP_4$ in the following elements AS2, AS3 and AS4. The first echo signal (e.g., in the example shown, the FID echo signal), therefore, is anticentrically ordered here, while the second echo signal (e.g., in the example shown, the stimulated echo), therefore, is centrically ordered.

The different reorderings for the stimulated echo and the FID echo provide that the artifacts of the two types of echo become more similar: if the central k-space lines of the two echoes are measured when the maximum magnetization is available (see FIG. 3: STE at the start, FID at the end), blurring will appear in the phase encoding direction in the images of the two echoes. In the data calculated from the two echo signals (e.g., a B0 map), the similarity of the artifacts may be advantageous since then, for example, edge artifacts are no longer intensified to the usual extent. In addition, the combination of a centric reordering with an anticentric reordering results in the possible advantage that the signal-to-noise ratio of both the stimulated echo signal and of the FID echo signal are maximized simultaneously. With a centric acquisition for the two echoes, this maximization may only be attained for the stimulated echo STE. As a result, the flip angle of the preparation RF pulses PHF1, PHF2 may be increased without the FID echo signal suffering too greatly as a consequence.

Figure 8:
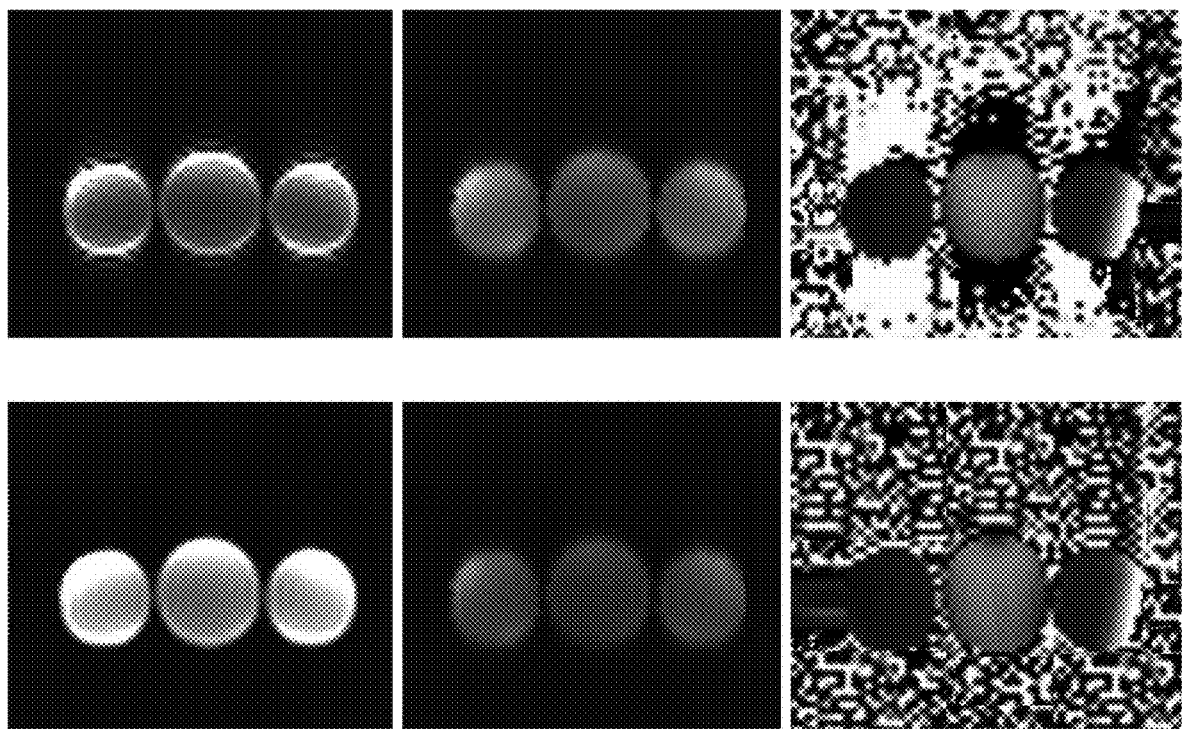
FIG. 8 shows exemplary measurement results with and without optimized k-space sampling.

A comparison of measured data of a phantom is shown in FIG. 8. In the top illustrations, the data was acquired with a centric reordering for the stimulated echo signal and the FID signal. In the bottom illustrations, the data was acquired with a centric reordering for the stimulated echo signal and an anticentric reordering for the FID signal. Here, an image reconstructed from the FID echo signal is represented on the left, an image reconstructed from the stimulated echo signal is represented in the center, and a $B_0$ map derived therefrom is represented on the right.

The image reconstructed from the FID echo signal, for example, exhibits considerably fewer artifacts and an increased signal-to-noise ratio if an anticentric reordering is applied. This also manifests itself in the improved signal-to-noise ratio and the reduced artifacts in the $B_0$ map. While with the same reordering considerable edge ghosting artifacts may clearly still be seen (illustration top right) in the vertical direction (e.g., the phase encoding direction applied here), this is barely still the case (illustration bottom right) with opposed reordering.

The methods described in detail above and the represented magnetic resonance device are merely exemplary embodiments that may be modified in a wide variety of ways by a person skilled in the art without departing from the scope of the invention. Further, use of the indefinite article "a" or "an" does not preclude the relevant features from also being present multiple times. Similarly, the term "unit" does not preclude the relevant components from including a plurality of cooperating sub-components that may optionally also be spatially distributed. Further, the term "echo" and "echo signal" may usually be used synonymously.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for the acquisition of echo signals during a magnetic resonance examination of an examination object, the method comprising:
   irradiating an imaging sequence into an examination region in which the examination object is located, wherein the imaging sequence comprises an acquisition section,
   wherein the acquisition section comprises acquiring a plurality of echo signals, each echo signal of the plurality of echo signals sampling a k-space region of a k-space,
   wherein the plurality of echo signals comprises a plurality of first echo signals and a plurality of second echo signals,
   wherein the plurality of first echo signals and the plurality of second echo signals are generated from different magnetization configurations,
   wherein the k-space regions sampled by the plurality of first echo signals sample the k-space in a different order to the k-space regions sampled by the plurality of second echo signals,
   wherein the plurality of first echo signals are FID echo signals, and the plurality of second echo signals are stimulated echo signals,
   wherein the FID echo signals are acquired before the stimulated echo signals, or the stimulated echo signals are acquired before the FID echo signals, and
   wherein the order of the k-space regions sampled by the plurality of first echo signals is characterized in that spacing from a k-space center decreases during the course of acquisition of the plurality of first echo signals.

2. The method of claim 1, wherein the acquisition section further comprises irradiating a plurality of gradient pulses in a phase encoding direction, which is capable of setting the k-space regions to be sampled by the echo signals.

3. The method of claim 1, wherein each of the k-space regions is a k-space line.

4. The method of claim 1, wherein the order of the k-space regions sampled by the plurality of second echo signals is characterized in that spacing from a k-space center increases during the course of acquisition of the plurality of second echo signals.

5. The method of claim 1, wherein the acquisition section further comprises:
   irradiating a plurality of readout RF pulses,
   wherein each readout RF pulse of the plurality of readout RF pulses is operable to trigger at least one first echo signal of the plurality of first echo signals, at least one second echo signal of the plurality of second echo signals, or the at least one first echo signal and the at least one second echo signal.

6. The method of claim 1, wherein the imaging sequence further comprises a preparation section preceding the acquisition section, and
   wherein a phasing of the plurality of second echo signals is prepared by the preparation section.

7. The method of claim 5, further comprising:
   generating a main magnetic field during the imaging sequence; and
   deriving a $B_0$ map that specifies an actual spatial distribution of a magnetic field strength of the main magnetic field, the $B_0$ map comprising the at least one first echo signal and the at least one second echo signal.

8. The method of claim 7, wherein the imaging sequence further comprises a preparation section preceding the acquisition section,
   wherein the imaging sequence comprises:
      irradiating at least two preparation RF pulses during the preparation section, wherein there is a time span between irradiating one of the at least two preparation RF pulses and irradiating another one of the at least two preparation RF pulses;
      irradiating a plurality of readout RF pulses during the acquisition section;
      acquiring one first echo signal of the plurality of first echo signals in each case after one readout RF pulse of the plurality of readout RF pulses, wherein there is a time span between irradiating the respective one readout RF pulse of the plurality of readout RF pulses and acquiring the respective one first echo signal;
      acquiring one second echo signal of the plurality of second echo signals in each case after one readout RF pulse of the plurality of readout RF pulses, wherein there is a time span between irradiating the respective one readout RF pulse of the plurality of readout RF pulses and acquiring the respective one second echo signal,
   wherein the time span between irradiating the one preparation RF pulse and irradiating the another one preparation RF pulse is chosen such that between an instant at which the at least one first echo signal is acquired, and an instant at which the at least one second echo signal is acquired, a signal component of echo signals of the plurality of echo signals from protons bound in water has a same phase difference to a signal component of echo signals of the plurality of echo signals from protons bound in fat.

9. The method of claim 8, wherein $$TS = N * \frac{1}{\delta_{WF} * (\gamma/2\pi) * B_{0,desired}} + TE_{STE} - TE_{FID}$$

wherein TS is the time span between irradiating the one of the at least two preparation RF pulses and irradiating the another one of the at least two preparation RF pulses, $TE_{STE}$ is the time span between irradiating the respective one readout RF pulse of the plurality of readout RF pulses and acquiring the respective one second echo signal, $TE_{FID}$ is the time span between irradiating the respective one readout RF pulse of the plurality of readout RF pulses and acquiring the respective one first echo signal, N is a whole number>0, $\delta_{WF}$ specifies a chemical shift of water and fat, and $\gamma$ specifies a gyromagnetic ratio of protons bound in water.

10. The method of claim 7, wherein the main magnetic field has a desired magnetic field strength of less than 2 T.

11. A magnetic resonance device operable to acquire echo signals during a magnetic resonance examination of an examination object, the magnetic resonance device comprising:

a coil operable to irradiate an imaging sequence into an examination region in which the examination object is located, wherein the imaging sequence comprises an acquisition section, wherein the acquisition section comprises acquisition of a plurality of echo signals, each echo signal of the plurality of echo signals sampling a k-space region of a k-space, wherein the plurality of echo signals comprises a plurality of first echo signals and a plurality of second echo signals, wherein the plurality of first echo signals and the plurality of second echo signals are generated from different magnetization configurations, and wherein the k-space regions sampled by the plurality of first echo signals sample the k-space in a different order to the k-space regions sampled by the plurality of second echo signals, wherein the plurality of first echo signals are FID echo signals, and the plurality of second echo signals are stimulated echo signals, wherein the FID echo signals are acquired before the stimulated echo signals, or the stimulated echo signals are acquired before the FID echo signals, and wherein the order of the k-space regions sampled by the plurality of first echo signals is characterized in that spacing from a k-space center decreases during the course of acquisition of the plurality of first echo signals.

12. In a non-transitory computer readable storage medium that stores instructions executable by a system control unit of a magnetic resonance device to acquire echo signals during a magnetic resonance examination of an examination object, the instructions comprising:

irradiating an imaging sequence into an examination region in which the examination object is located, wherein the imaging sequence comprises an acquisition section, wherein the acquisition section comprises acquiring a plurality of echo signals, each echo signal of the plurality of echo signals sampling a k-space region of a k-space, wherein the plurality of echo signals comprises a plurality of first echo signals and a plurality of second echo signals, wherein the plurality of first echo signals and the plurality of second echo signals are generated from different magnetization configurations, wherein the k-space regions sampled by the plurality of first echo signals sample the k-space in a different order to the k-space regions sampled by the plurality of second echo signals, wherein the plurality of first echo signals are FID echo signals, and the plurality of second echo signals are stimulated echo signals, wherein the FID echo signals are acquired before the stimulated echo signals, or the stimulated echo signals are acquired before the FID echo signals, and wherein the order of the k-space regions sampled by the plurality of first echo signals is characterized in that spacing from a k-space center decreases during the course of acquisition of the plurality of first echo signals.

13. The non-transitory computer readable storage medium of claim 12, wherein the acquisition section further comprises irradiating a plurality of gradient pulses in a phase encoding direction, which is capable of setting the k-space regions to be sampled by the echo signals.

14. The non-transitory computer readable storage medium of claim 12, wherein each of the k-space regions is a k-space line.

15. The non-transitory computer readable storage medium of claim 12, wherein the order of the k-space regions sampled by the plurality of second echo signals is characterized in that spacing from a k-space center increases during the course of acquisition of the plurality of second echo signals.

* * * * *